(12) United States Patent
Tan et al.

(10) Patent No.: US 8,816,868 B2
(45) Date of Patent: Aug. 26, 2014

(54) ADAPTIVE LOW-BATTERY WARNINGS FOR BATTERY-POWERED ELECTRONIC DEVICES

(75) Inventors: Liquan Tan, Sunnyvale, CA (US); Wing Kong Low, Sunnyvale, CA (US); Alda Y. Luong, Oakland, CA (US)

(73) Assignee: Apple Inc., Cupertino, CA (US)

( * ) Notice: Subject to any disclaimer, the term of this patent is extended or adjusted under 35 U.S.C. 154(b) by 608 days.

(21) Appl. No.: 13/154,278

(22) Filed: Jun. 6, 2011

(65) Prior Publication Data
US 2012/0306655 A1    Dec. 6, 2012

(51) Int. Cl.
G08B 21/00    (2006.01)
G01R 31/36    (2006.01)
G06F 1/28    (2006.01)

(52) U.S. Cl.
CPC .......... *G01R 31/3651* (2013.01); *G01R 31/362* (2013.01); *G06F 1/28* (2013.01)
USPC .................... 340/636.1; 340/540; 340/636.13; 340/636.15; 701/22; 702/63; 320/136

(58) Field of Classification Search
CPC ........... G06F 1/263; G06F 1/266; G06F 1/28; G06F 1/30; G06F 21/81
USPC ..................... 340/540, 636.1, 426.16, 426.18, 340/636.11–636.21; 463/37, 29, 42; 701/1, 701/2, 36; 702/63, 182, 183; 706/2, 1, 12, 706/15, 21; 320/136
See application file for complete search history.

(56) References Cited

U.S. PATENT DOCUMENTS

| | | | |
|---|---|---|---|
| 6,097,175 A * | 8/2000 | Yoon | 320/132 |
| 6,373,256 B1 * | 4/2002 | Hanjani et al. | 324/433 |
| 7,548,491 B2 * | 6/2009 | Macfarlane | 367/198 |
| 7,778,186 B2 * | 8/2010 | Oman et al. | 340/5.61 |
| 8,474,569 B2 * | 7/2013 | Seymour et al. | 180/287 |
| 2003/0034779 A1 * | 2/2003 | Juncker et al. | 324/426 |
| 2003/0231550 A1 * | 12/2003 | Macfarlane | 367/198 |
| 2005/0099275 A1 * | 5/2005 | Kamdar et al. | 340/426.18 |
| 2007/0182576 A1 * | 8/2007 | Proska et al. | 340/636.1 |
| 2007/0272457 A1 * | 11/2007 | Kodama et al. | 180/65.3 |
| 2008/0318672 A1 * | 12/2008 | Ramaswamy et al. | 463/29 |
| 2009/0055330 A1 * | 2/2009 | Medasani et al. | 706/2 |
| 2009/0096576 A1 * | 4/2009 | Oman et al. | 340/5.62 |
| 2009/0177769 A1 * | 7/2009 | Roberts | 709/224 |
| 2010/0085179 A1 * | 4/2010 | Shank et al. | 340/458 |
| 2010/0188248 A1 * | 7/2010 | Sultan et al. | 340/825 |
| 2010/0305793 A1 * | 12/2010 | Kidston et al. | 701/22 |
| 2010/0317324 A1 * | 12/2010 | Brown et al. | 455/411 |
| 2011/0199533 A1 * | 8/2011 | Drader et al. | 348/345 |
| 2012/0187916 A1 * | 7/2012 | Duer et al. | 320/136 |
| 2012/0210389 A1 * | 8/2012 | Brown et al. | 726/1 |

(Continued)

*Primary Examiner* — Hoi Lau
(74) *Attorney, Agent, or Firm* — Park, Vaughan, Fleming & Dowler LLP; Chia-Hsin Suen

(57) ABSTRACT

The disclosed embodiments provide a system that facilitates the use of an electronic device. The electronic device may be a keyboard, a mouse, a trackpad, a remote control, a mobile phone, a wireless phone, a toy, a portable media player, a game controller, and/or a camera. During operation, the system monitors a state-of-charge of a battery used to power the electronic device. Next, the system calculates a charge threshold associated with a low-battery warning for the battery based on the monitored state-of-charge. If the state-of-charge of the battery reaches the charge threshold, the system generates the low-battery warning.

22 Claims, 7 Drawing Sheets

(56) References Cited

U.S. PATENT DOCUMENTS

| | | | |
|---|---|---|---|
| 2012/0249284 A1* | 10/2012 | Almquist et al. | 340/3.1 |
| 2012/0306655 A1* | 12/2012 | Tan et al. | 340/636.1 |
| 2013/0002441 A1* | 1/2013 | Khan | 340/636.1 |
| 2013/0018974 A1* | 1/2013 | Itani et al. | 709/206 |
| 2013/0173101 A1* | 7/2013 | Gilman et al. | 701/22 |
| 2013/0217499 A1* | 8/2013 | Ramaswamy et al. | 463/37 |
| 2013/0231880 A1* | 9/2013 | DUNCAN et al. | 702/63 |
| 2013/0257344 A1* | 10/2013 | Millet et al. | 320/104 |

* cited by examiner

ADAPTIVE LOW-BATTERY WARNINGS FOR BATTERY-POWERED ELECTRONIC DEVICES

BACKGROUND

1. Field

The present embodiments relate to battery-powered electronic devices. More specifically, the present embodiments relate to techniques for adaptively generating low-battery warnings based on charge-consumption patterns associated with batteries used to power the electronic devices.

2. Related Art

Batteries may be used to power a variety of electronic devices. For example, AA and/or AAA batteries may be used in devices such as cameras, toys, flashlights, peripheral devices, game controllers, and/or remote controls. On the other hand, lithium-ion and/or lithium-polymer batteries may be used to power mobile phones, portable media players, laptop computers, and/or tablet computers.

In addition, battery-powered electronic devices may include functionality to generate "low-battery warnings" that notify users of reduced states-of-charge in the batteries that may subsequently disrupt use of the electronic devices. For example, a mobile phone may generate a pop-up containing a low-battery warning after the state-of-charge of the battery in the mobile phone drops below 10%. The pop-up may thus allow a user of the mobile phone to plug in the mobile phone and/or reduce the power consumption of the mobile phone before the battery fully depletes and causes the mobile phone to power off.

However, the same types of electronic devices may consume battery power at different rates based on usage patterns associated with the electronic devices. For example, a wireless keyboard may be used by a first user for an average of two hours a day, while the same model of wireless keyboard may be used by a second user for an average of six hours a day. The second user may thus replace and/or recharge the batteries in his/her wireless keyboard about three times as frequently as the first user.

Different battery depletion rates may also cause low-battery warnings to be generated at different times prior to full battery depletion. In turn, such variance in the timing of low-battery warnings may adversely affect the use of battery-powered electronic devices. For example, a low-battery warning for a wireless keyboard may be displayed after the battery for the wireless keyboard falls below 10% capacity. As a result, an infrequent user of the wireless keyboard may find the low-battery warning to be a nuisance because the low-battery warning may be displayed for several weeks before the battery in the wireless keyboard is fully depleted. On the other hand, the low-battery warning may not provide enough notice to a frequent user of the wireless keyboard if the low-battery warning is shown to the user only a few days before the battery in the wireless keyboard runs out of power.

Hence, use of battery-powered electronic devices may be facilitated by mechanisms that generate low-battery warnings for the electronic devices in a consistent and/or timely manner.

SUMMARY

The disclosed embodiments provide a system that facilitates the use of an electronic device. The electronic device may be a keyboard, a mouse, a trackpad, a remote control, a mobile phone, a wireless phone, a toy, a portable media player, a game controller, and/or a camera. During operation, the system monitors a state-of-charge of a battery used to power the electronic device. To monitor the state-of-charge of the battery, the system periodically measures a voltage of the battery, determines the state-of-charge of the battery based on the measured voltage, and records the state-of-charge and a timestamp associated with the measured voltage.

Next, the system calculates a charge threshold associated with a low-battery warning for the battery based on the monitored state-of-charge. To calculate the charge threshold, the system calculates an average charge consumption associated with the battery using the monitored state-of-charge and multiplies the average charge consumption by a trigger period associated with the low-battery warning. The trigger period may correspond to a pre-specified period of time before the battery is fully depleted. In addition, the system may calculate the average charge consumption by calculating a total charge consumption associated with a monitoring window of the monitored state-of-charge and dividing the total charge consumption by a monitoring period spanned by the monitoring window.

If the state-of-charge of the battery reaches the charge threshold, the system generates the low-battery warning. For example, the system may generate the low-battery warning by displaying the low-battery warning to a user of the electronic device. On the other hand, if the state-of-charge of the battery has not reached the charge threshold, the system recalculates the charge threshold based on the monitored state-of-charge. By recalculating the charge threshold until the state-of-charge reaches the charge threshold, the system may facilitate the timely and/or consistent generation of the low-battery warning, independently of changes to the powering and/or use of the electronic device.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
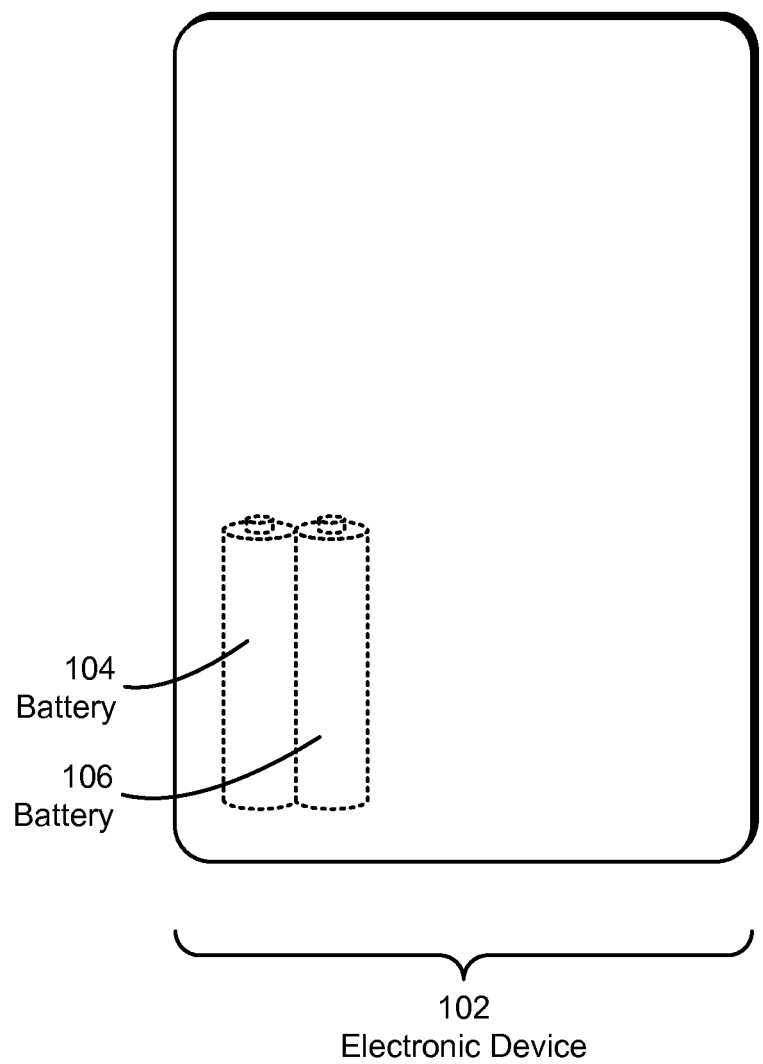
FIG. 1 shows an electronic device in accordance with an embodiment.

FIG. 1 shows an electronic device 102 in accordance with an embodiment. Electronic device 102 may correspond to a keyboard, a mouse, a trackpad, a remote control, a wireless and/or mobile phone, a toy, a camera, a game controller, a portable media player, and/or other device that is powered by one or more batteries 104-106. For example, electronic device 102 may be used with standard-sized batteries such as AAA batteries, AA batteries, C batteries, D batteries, and/or nine-volt batteries. On the other hand, batteries 104-106 may correspond to lithium-ion and/or lithium-polymer batteries that are designed to fit within the enclosure of electronic device 102.

As electronic device 102 is used, chemical energy stored in batteries 104-106 may be converted into electrical energy that is used to operate one or more electrical components in electronic device 102. For example, batteries 104-106 may power a processor, memory, storage, touchscreen, microphone, speaker, and/or radio transceiver in a mobile phone, allowing a user of the mobile phone to make and receive calls, send and receive emails, and/or browse the web on the mobile phone. Because the energy stored in batteries 104-106 is limited, batteries 104-106 may be recharged and/or replaced to enable continued use of electronic device 102. Conversely, full depletion of batteries 104-106 during use of electronic device 102 may cause electronic device 102 to power off, and in turn, disrupt use of electronic device 102 by a user.

Figure 2:
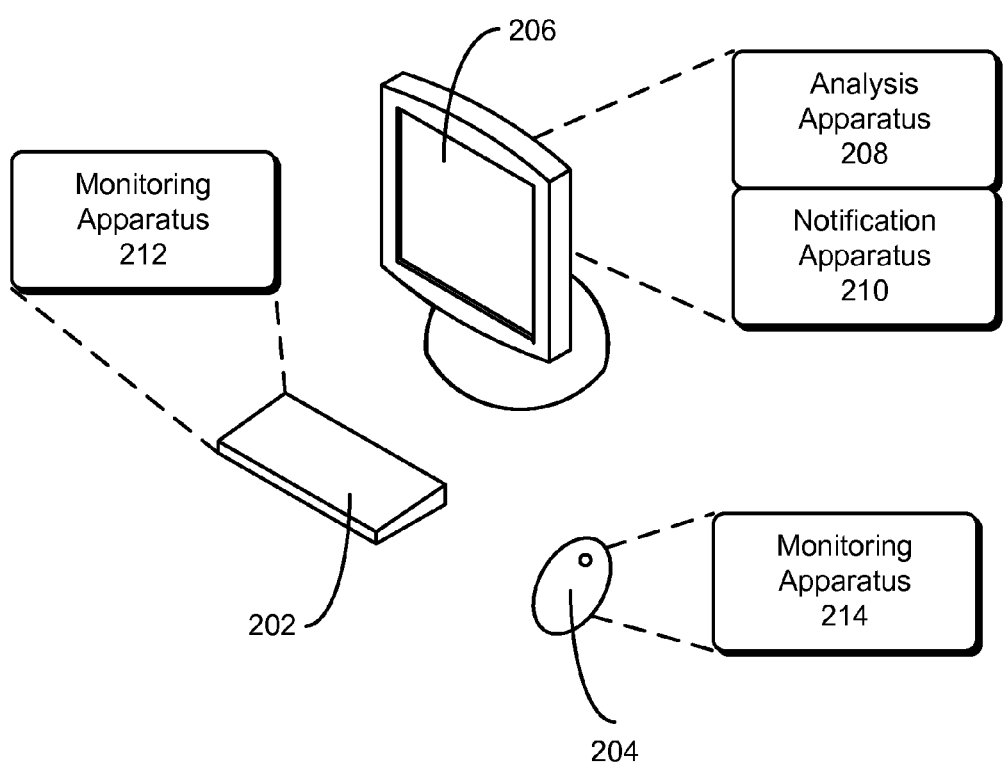
FIG. 2 shows a set of electronic devices in accordance with an embodiment.

Electronic device 102 may also be configured for use with other electronic devices. As shown in FIG. 2, a set of electronic devices 202-206 may include functionality to communicate with one another. For example, electronic device 202 may correspond to a wireless keyboard, electronic device 204 may correspond to a wireless mouse, and electronic device 206 may be a laptop and/or desktop computer for which electronic devices 202-204 operate as input devices. As a result, a user may interact with the computer system represented by electronic device 206 by providing input to electronic devices 202-204 and receiving output from a display in electronic device 206.

To facilitate use of electronic devices 202-206, low-battery warnings may be generated to notify a user that limited battery life in one or more electronic devices 202-204 may disrupt operation of the electronic device(s) in the near future. For example, electronic devices 202-204 may provide battery "gas gauges" that convert voltage and/or current measurements from batteries used to power electronic devices 202-204 into state-of-charge values for the batteries. The state-of-charge values may be obtained by electronic device 206 and compared with a predefined threshold (e.g., 10%) for low-battery states in electronic devices 202-204. Electronic device 206 may then display low-battery warnings for electronic devices 202-204 if the state-of-charge values have reached or dropped below the threshold.

However, batteries may be fully depleted at different rates based on the devices (e.g., electronic devices 202-206) powered by the batteries, the types of batteries used within the devices, and/or the usage patterns associated with the devices. First, the same types of batteries may be associated with different depletion rates for different electronic devices (e.g., electronic devices 202-206). For example, two AA batteries may power a first type of game controller for 36 hours and a second type of game controller for 55 hours. Next, different depletion rates may result from the use of different types of batteries to power the same electronic device. For example, a set of alkaline AA batteries may power a digital camera for 1-3 times as long as a set of nickel-cadmium (NiCd) AA batteries. Finally, the period of time over which an electronic device is powered by a battery may vary based on the amount of use associated with the electronic device. For example, frequent use of a wireless keyboard may fully deplete the batteries in the wireless keyboard after one month, while occasional use of the wireless keyboard may allow the same types of batteries to power the wireless keyboard for over two months.

Such differences in battery depletion rates may additionally cause low-battery warnings to be displayed at different times prior to full battery depletion. For example, low-battery warnings for a wireless mouse may be triggered after the state-of-charge of the battery in the wireless mouse drops below 10%. A user who infrequently uses the wireless mouse may be shown a low-battery warning for over a month before the battery is fully depleted, while a user who constantly uses the wireless mouse may be notified of a low battery only a few days before the battery runs out of power. As a result, low-battery warnings may irritate some users if the low-battery warnings are displayed for long periods of time before the batteries associated with the low-battery warnings run out of power. On the other hand, the same low-battery warnings may not provide enough notice for other users if the low-battery warnings are displayed only a few hours or a few days before the batteries are fully depleted.

Furthermore, low-battery warnings may be generated at different times prior to full battery depletion in different devices (e.g., electronic devices 202-206). For example, a user may receive a low-battery warning for a wireless mouse two weeks before the wireless mouse powers off and a low-battery warning for a wireless keyboard two days before the battery for the wireless keyboard runs out of power. Such device-based inconsistencies in the timing of low-battery warnings may cause confusion for users by preventing the users from using the same time scale to manage low-battery states in different devices.

In one or more embodiments, electronic devices 202-206 include functionality to generate low-battery warnings in a consistent and/or timely manner. For example, electronic devices 202-206 may be configured to generate low-battery warnings approximately two weeks before the batteries in electronic devices 202-206 are fully depleted, regardless of the types of devices used, the types of batteries used to power the devices, and/or the usage patterns associated with each device.

More specifically, monitoring apparatuses 212-214 in each battery-powered electronic device (e.g., electronic devices 202-204) may monitor the state-of-charge of a battery used to power the electronic device. Each monitoring apparatus 212-214 may periodically (e.g., once a minute, once every five minutes, etc.) measure a voltage of the corresponding battery, determine the state-of-charge of the battery based on the measured voltage, and record the state-of-charge and a timestamp associated with the measured voltage.

Next, an analysis apparatus 208 in electronic device 206 and/or electronic devices 202-204 may calculate a charge threshold associated with a low-battery warning for the battery based on the monitored state-of-charge. The charge threshold may represent a state-of-charge of the battery at which a low-battery warning should be generated to provide a certain amount of notice to the user before the battery is fully depleted. In other words, the charge threshold may allow the low-battery warning to be generated at a pre-specified period before the battery is fully depleted.

If the state-of-charge reaches or falls below the charge threshold, a notification apparatus 210 in electronic device 206 and/or electronic devices 202-204 may generate a low-battery warning. For example, notification apparatus 210 may display the low-battery warning to the user through a graphical user interface (GUI) in electronic device 206 and/or electronic devices 202-204.

On the other hand, if the state-of-charge has not reached the charge threshold, notification apparatus 210 may recalculate the charge threshold based on the monitored state-of-charge (e.g., from monitoring apparatuses 212-214). For example, notification apparatus 210 may recalculate the charge threshold after obtaining a new state-of-charge from monitoring apparatus 214 every five minutes to maintain an up-to-date charge threshold that reflects the usage patterns associated with electronic device 204. Calculation and use of charge thresholds associated with low-battery warnings is discussed in further detail below with respect to FIG. 3.

Figure 3:
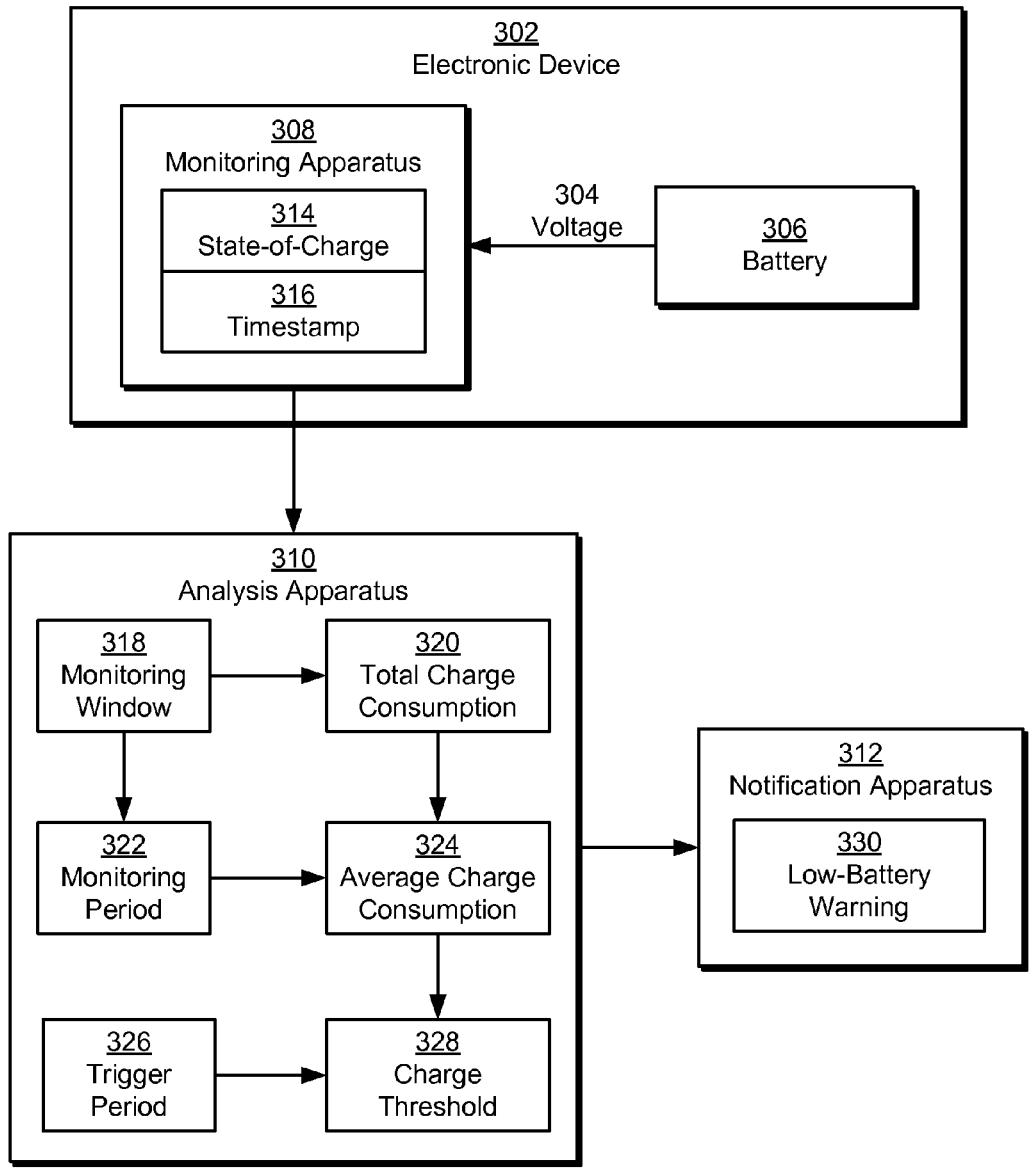
FIG. 3 shows a system for facilitating use of an electronic device in accordance with an embodiment.

FIG. 3 shows a system for facilitating use of an electronic device 302 in accordance with an embodiment. Electronic device 302 may correspond to a keyboard, a mouse, a trackpad, a remote control, a phone, a toy, a camera, a game controller, a portable media player, and/or other device that is powered by a battery 306. In addition, electronic device 302 may be configured to communicate with a different electronic device. For example, electronic device 302 may function as a wireless input device (e.g., keyboard, mouse, trackpad, remote control, webcam, game controller) that obtains input from a user and transmits data associated with the input to another electronic device (e.g., laptop computer, desktop computer, game console, television) with which the user is interacting.

As mentioned above, the system of FIG. 3 may be used to generate a low-battery warning 330 for a battery 306 that supplies power to electronic device 302. First, a monitoring apparatus 308 in electronic device 302 may periodically measure a voltage 304 of battery 306 and determine a state-of-charge 314 of battery 306 based on the measured voltage 304. For example, monitoring apparatus 308 may be implemented by a microcontroller unit (MCU) in electronic device 302 that converts measurements of voltage 304 into state-of-charge 314 values using one or more discharge curves for battery 306.

Next, monitoring apparatus 308 may record state-of-charge 314 and a timestamp 316 associated with the measured voltage 304. For example, monitoring apparatus 308 may maintain a log file containing a state-of-charge 314 calculated from a measurement of voltage 304 and a value for timestamp 316 representing the time at which the measurement was made. Alternatively, monitoring apparatus 308 may transmit voltage 304, state-of-charge 314, and/or timestamp 316 to another electronic device (e.g., computer system) for processing and/or recording of voltage 304, state-of-charge 314, and/or timestamp 316.

An analysis apparatus 310 may then calculate a charge threshold 328 using the monitored state-of-charge 314 and timestamp 316. In one or more embodiments, charge threshold 328 is used to generate low-battery warning 330 at a time that represents a pre-specified period before battery 306 is fully depleted. For example, charge threshold 328 may correspond to a value for state-of-charge 314 that represents a full depletion of battery 306 in ten days.

As a result, charge threshold 328 may vary based on the type of battery 306 used to power electronic device 302, the type of electronic device 302 powered by battery 306, and/or the usage patterns associated with electronic device 302. For example, charge threshold 328 may be lower if battery 306 is associated with a higher capacity, electronic device 302 consumes less power, and/or electronic device 302 is infrequently used. Conversely, charge threshold 328 may be higher if battery 306 is associated with a lower capacity, electronic device 302 consumes more power, and/or electronic device 302 is frequently used.

To calculate charge threshold 328, analysis apparatus 310 may first calculate a total charge consumption 320 associated with a monitoring window 318 of the monitored state-of-charge 314. Monitoring window 318 may represent an adjustable, sliding window of time from which values for state-of-charge 314 and/or timestamp 316 are obtained to calculate charge threshold 328. For example, monitoring window 318 may correspond to a ten-day window that ends at the most recent value of timestamp 316 obtained from monitoring apparatus 308 and begins ten days prior to the date represented by the most recent value of timestamp 316. Total charge consumption 320 may thus be calculated by subtracting the most recent and/or lowest value for state-of-charge 314 within monitoring window 318 from the oldest and/or highest value for state-of-charge 314 within monitoring window 318. Continuing with the previous example, total charge consumption 320 for a ten-day monitoring window 318 may be calculated by subtracting the newest value for state-of-charge 314 from a value for state-of-charge 314 that was obtained ten days prior to the newest value.

Next, analysis apparatus 310 may calculate an average charge consumption 324 by dividing total charge consumption 320 by a monitoring period 322 spanned by monitoring window 318. For example, a daily average charge consumption 324 may be calculated by dividing total charge consumption 320 by the number of days spanned by monitoring window 318.

Finally, analysis apparatus 310 may calculate charge threshold 328 based on average charge consumption 324 and a trigger period 326 associated with low-battery warning 330. Trigger period 326 may represent the pre-specified period of time before battery 306 is fully depleted at which low-battery warning 330 is to be generated. As a result, charge threshold

328 may be obtained by multiplying average charge consumption 324 by trigger period 326. For example, charge threshold 328 may be calculated by multiplying a daily average charge consumption 324 by the number of days in trigger period 326.

Charge threshold 328 may then be used to generate low-battery warning 330 within a notification apparatus 312. In particular, notification apparatus 312 may generate low-battery warning 330 if the current value of state-of-charge 314 reaches charge threshold 328. For example, notification apparatus 312 may generate low-battery warning 330 by displaying a pop-up window containing low-battery warning 330 within a display associated with electronic device 302 and/or another electronic device.

On the other hand, if the current value of state-of-charge 314 has not reached charge threshold 328, analysis apparatus 310 may recalculate charge threshold 328 based on monitored values of state-of-charge 314. For example, analysis apparatus 310 may recalculate total charge consumption 320 using a new monitoring window 318 that includes the current value of state-of-charge 314, obtain a new value for average charge consumption 324 from total charge consumption 320, and multiply the new average charge consumption 324 by trigger period 326 to obtain a new value of charge threshold 328.

Consequently, the system of FIG. 3 may facilitate timeliness and/or consistency in the generation of low-battery warning 330, regardless of the usage patterns and/or types of batteries associated with electronic device 302. First, the depletion rate of battery 306 within electronic device 302 may be identified by continuous monitoring of state-of-charge 314. Next, a sliding monitoring window 318 may ensure that total charge consumption 320 and average charge consumption 324 reflect the most recent usage patterns for electronic device 302. The calculation of charge threshold 328 using trigger period 326 may additionally facilitate the generation of low-battery warning 330 at a time that is neither too early nor too late for a user of electronic device 302. Finally, the continuous update of charge threshold 328 may ensure that changes to the powering and/or use of electronic device 302 do not affect the generation of low-battery warning 330 at the pre-specified period before battery 306 is fully depleted.

Those skilled in the art will appreciate that the system of FIG. 3 may be implemented in a variety of ways. First, monitoring apparatus 308, analysis apparatus 310, and notification apparatus 312 may be implemented by electronic device 302. For example, a mobile phone and/or tablet computer may include functionality to monitor state-of-charge 314, calculate charge threshold 328, and display low-battery warning 330 to a user. Alternatively, some or all of monitoring apparatus 308, analysis apparatus 310, and/or notification apparatus 312 may reside on a different electronic device that includes functionality to communicate with electronic device 302. For example, a wireless keyboard may transmit values for voltage 304, state-of-charge 314, and/or timestamp 316 to a device driver in a computer system for which the wireless keyboard is an input device. The device driver may process the transmitted values to calculate charge threshold 328, and an operating system in the computer system may display low-battery warning 330 in a pop-up window to the user once state-of-charge 314 reaches charge threshold 328.

Figure 4:
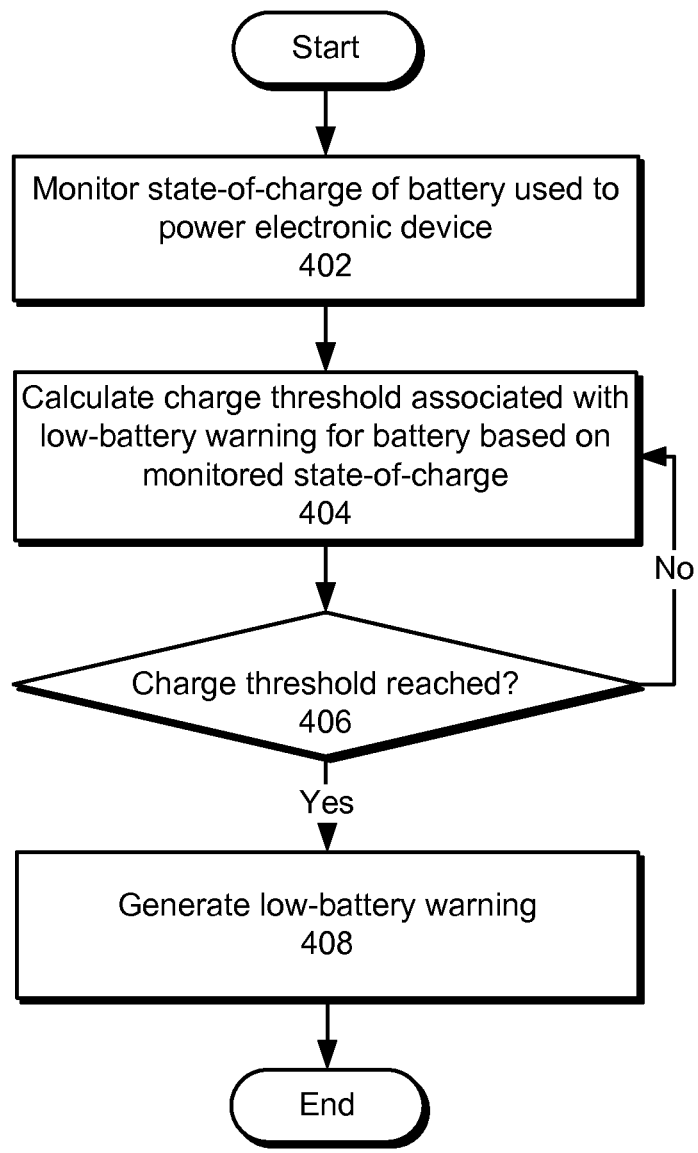
FIG. 4 shows a flowchart illustrating the process of facilitating use of an electronic device in accordance with an embodiment.

FIG. 4 shows a flowchart illustrating the process of facilitating use of an electronic device in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

Initially, a state-of-charge of a battery used to power the electronic device is monitored (operation 402). Monitoring of a battery's state-of-charge is discussed in further detail below with respect to FIG. 5. Next, a charge threshold associated with a low-battery warning for the battery is calculated based on the monitored state-of-charge (operation 404). Calculation of a charge threshold associated with a low-battery warning is discussed in further detail below with respect to FIG. 6.

The state-of-charge may reach the charge threshold (operation 406) as the battery is used to power the electronic device. For example, the state-of-charge may gradually drop as the battery supplies power to the electronic device and eventually reach the charge threshold if the battery is not recharged and/or replaced. If the charge threshold has not been reached, the charge threshold is recalculated based on the monitored state-of-charge (operation 404). In other words, the charge threshold may be continuously recalculated as long as the state-of-charge has not reached the charge threshold.

If the battery's state-of-charge has reached the charge threshold, a low-battery warning is generated (operation 408). For example, the low-battery warning may correspond to a visual and/or audio notification that alerts a user of the need to replace and/or recharge the battery before the battery fully depletes and disrupts use of the electronic device.

Figure 5:
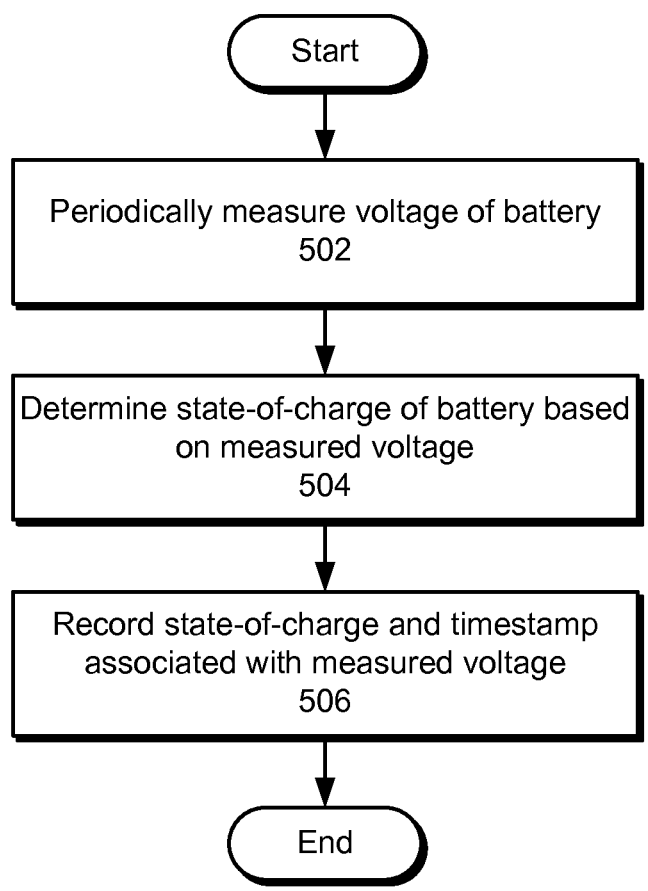
FIG. 5 shows a flowchart illustrating the process of monitoring the state-of-charge of a battery in accordance with an embodiment.

FIG. 5 shows a flowchart illustrating the process of monitoring the state-of-charge of a battery in accordance with an embodiment. In one or more embodiments, one or more of the steps may be omitted, repeated, and/or performed in a different order. Accordingly, the specific arrangement of steps shown in FIG. 5 should not be construed as limiting the scope of the embodiments.

To monitor the state-of-charge, a voltage of the battery is periodically measured (operation 502). Next, the state-of-charge of the battery is determined based on the measured voltage (operation 504). For example, the measured voltage may be converted into the state-of-charge using one or more discharge curves for the battery. Finally, the state-of-charge and a timestamp associated with the measured voltage are recorded (operation 506). For example, the measured voltage, state-of-charge, and/or timestamp may be stored in a log file for subsequent processing and/or retrieval.

Figure 6:
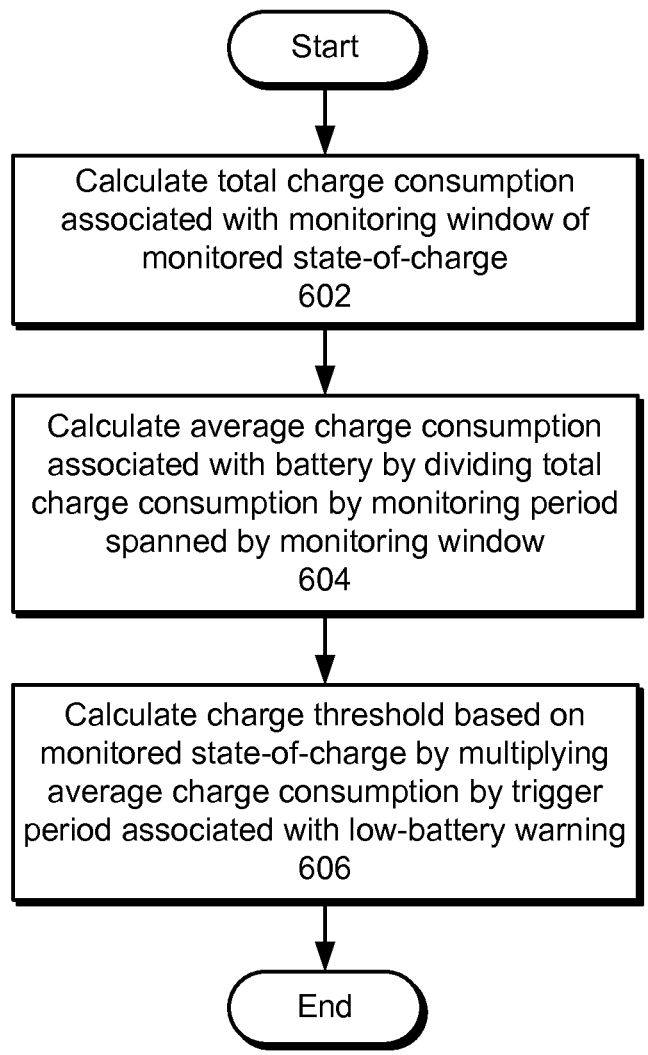
FIG. 6 shows a flowchart illustrating the process of calculating a charge threshold associated with a low-battery warning for a battery in accordance with an embodiment.

FIG. 6 shows a flowchart illustrating the process of calculating a charge threshold associated with a low-battery warning for a battery in accordance with an embodiment. In one or more embodiments, one or more of the steps may be omitted, repeated, and/or performed in a different order. Accordingly, the specific arrangement of steps shown in FIG. 6 should not be construed as limiting the scope of the embodiments.

First, a total charge consumption associated with a monitoring window of a monitored state-of-charge of the battery is calculated (operation 602). The total charge consumption may be calculated by subtracting the newest and/or lowest value for the state-of-charge within the monitoring window from the oldest and/or highest value for the state-of-charge within the monitoring window.

Next, an average charge consumption associated with the battery is calculated by dividing the total charge consumption by a monitoring period spanned by the monitoring window (operation 604). For example, a daily average charge consumption may be obtained by dividing the total charge consumption by the number of days in the monitoring window. Alternatively, the average charge consumption for a different unit of time (e.g., one hour, 12 hours, one week) may be calculated by dividing the total charge consumption by the number of units of time in the monitoring window.

Finally, the charge threshold is calculated based on the monitored state-of-charge by multiplying the average charge consumption by a trigger period associated with the low-battery warning (operation 606). The trigger period may correspond to a pre-specified period of time before the battery is fully depleted. For example, the charge threshold may be calculated by multiplying a daily average charge consumption by the number of days in the trigger period.

In other words, the charge threshold may be calculated using the following equation:

$$T\% = \frac{n\%}{D_{window}} \times D_{Trigger}$$

Within the equation, T % may represent the charge threshold, n % may represent the total charge consumption, $D_{window}$ may represent the monitoring window, and $D_{Trigger}$ may represent the trigger period.

Figure 7:
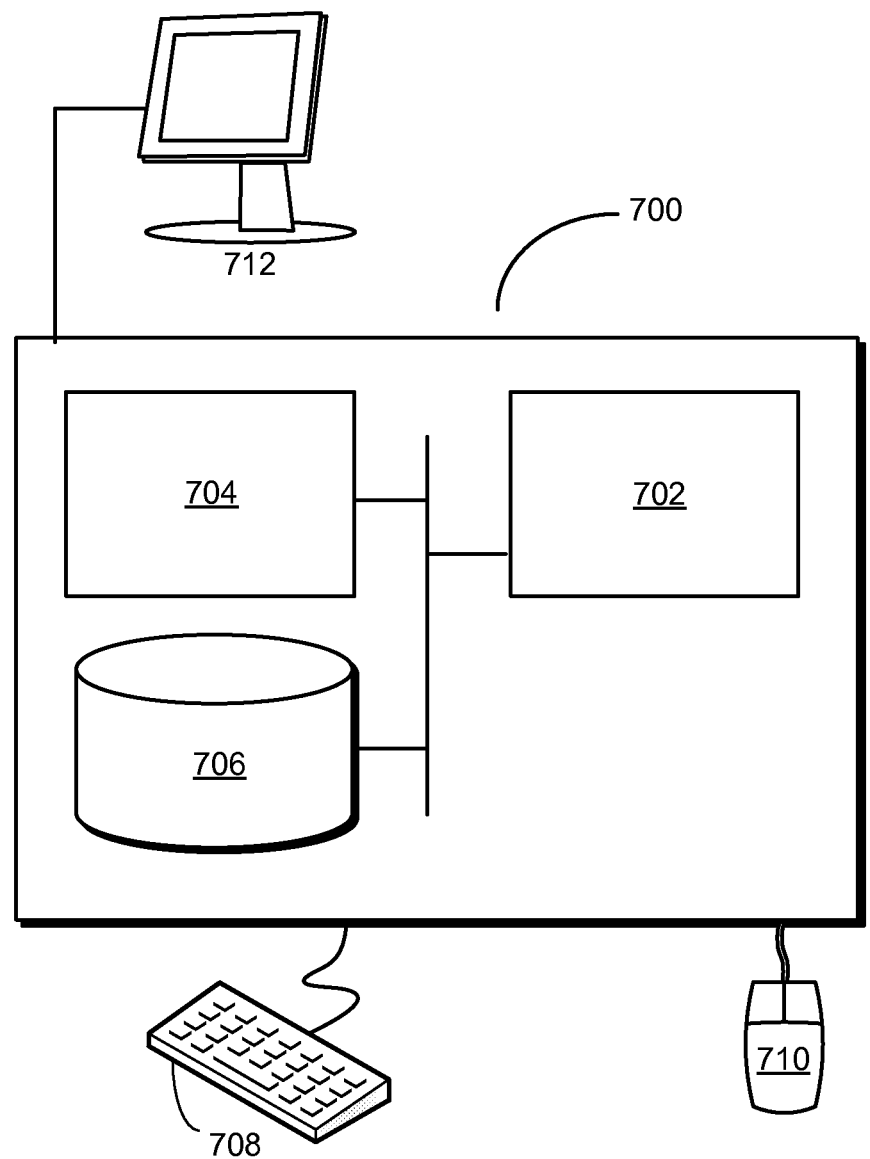
FIG. 7 shows a computer system in accordance with an embodiment.

FIG. 7 shows a computer system 700 in accordance with an embodiment. Computer system 700 includes a processor 702, memory 704, storage 706, and/or other components found in peripheral devices, portable electronic devices, and/or consumer electronic devices. Processor 702 may support parallel processing and/or multi-threaded operation with other processors in computer system 700. Computer system 700 may also include input/output (I/O) devices such as a keyboard 708, a mouse 710, and a display 712.

Computer system 700 may include functionality to execute various components of the present embodiments. In particular, computer system 700 may include an operating system (not shown) that coordinates the use of hardware and software resources on computer system 700, as well as one or more applications that perform specialized tasks for the user. To perform tasks for the user, applications may obtain the use of hardware resources on computer system 700 from the operating system, as well as interact with the user through a hardware and/or software framework provided by the operating system.

In one or more embodiments, computer system 700 provides a system for facilitating use of an electronic device. The system may include a monitoring apparatus that monitors a state-of-charge of a battery used to power the electronic device. The system may also include an analysis apparatus that calculates a charge threshold associated with a low-battery warning for the battery based on the monitored state-of-charge. Finally, the system may include a notification apparatus that generates the low-battery warning if the state-of-charge of the battery reaches the charge threshold.

In addition, one or more components of computer system 700 may be remotely located and connected to the other components over a network. Portions of the present embodiments (e.g., monitoring apparatus, analysis apparatus, notification apparatus, etc.) may also be located on different nodes of a distributed system that implements the embodiments. For example, the present embodiments may be implemented using a cloud computing system that monitors and manages the use of batteries in remote electronic devices.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for facilitating the use of an electronic device, comprising:
   monitoring a state-of-charge of a battery used to power the electronic device;
   calculating a charge threshold associated with a low-battery warning for the battery based on the monitored state-of-charge by:
      calculating an average charge consumption associated with the battery using the monitored state-of-charge; and
      multiplying the average charge consumption by a trigger period associated with the low-battery warning; and
   if the state-of-charge of the battery reaches the charge threshold, generating the low-battery warning.

2. The method of claim 1, further comprising:
   if the state-of-charge of the battery has not reached the charge threshold, recalculating the charge threshold based on the monitored state-of-charge.

3. The method of claim 1, wherein monitoring the state-of-charge of the battery involves:
   periodically measuring a voltage of the battery;
   determining the state-of-charge of the battery based on the measured voltage; and
   recording the state-of-charge and a timestamp associated with the measured voltage.

4. The method of claim 1, wherein calculating the average charge consumption associated with the battery using the monitored state-of-charge involves:
   calculating a total charge consumption associated with a monitoring window of the monitored state-of-charge; and
   dividing the total charge consumption by a monitoring period spanned by the monitoring window.

5. The method of claim 1, wherein the trigger period corresponds to a pre-specified period of time before the battery is fully depleted.

6. The method of claim 1, wherein generating the low-battery warning involves:
   displaying the low-battery warning to a user of the electronic device.

7. The method of claim 1, wherein the electronic device is at least one of a keyboard, a mouse, a trackpad, a remote control, a mobile phone, a wireless phone, a toy, a portable media player, a game controller, and a camera.

8. A system for facilitating the use of an electronic device, comprising:
   a monitoring apparatus configured to monitor a state-of-charge of a battery used to power the electronic device;
   an analysis apparatus configured to calculate a charge threshold associated with a low-battery warning for the battery based on the monitored state-of-charge by:
      calculating an average charge consumption associated with the battery using the monitored state-of-charge; and
      multiplying the average charge consumption by a trigger period associated with the low-battery warning; and
   a notification apparatus configured to generate the low-battery warning if the state-of-charge of the battery reaches the charge threshold.

9. The system of claim 8, wherein monitoring the state-of-charge of the battery involves:
   periodically measuring a voltage of the battery;
   determining the state-of-charge of the battery based on the measured voltage; and recording the state-of-charge and a timestamp associated with the measured voltage.

10. The system of claim 8, wherein calculating the average charge consumption associated with the battery using the monitored state-of-charge involves:
- calculating a total charge consumption associated with a monitoring window of the monitored state-of-charge; and
- dividing the total charge consumption by a monitoring period spanned by the monitoring window.

11. The system of claim 8, wherein the trigger period corresponds to a pre-specified period of time before the battery is fully depleted.

12. The system of claim 8, wherein the analysis apparatus is associated with at least one of the electronic device and a different electronic device configured to communicate with the electronic device.

13. The system of claim 8, wherein the electronic device is at least one of a keyboard, a mouse, a trackpad, a remote control, a mobile phone, a wireless phone, a toy, a portable media player, a game controller, and a camera.

14. A computer-readable storage medium storing instructions that when executed by a computer cause the computer to perform a method for facilitating the use of an electronic device, the method comprising:
- monitoring a state-of-charge of a battery used to power the electronic device;
- calculating a charge threshold associated with a low-battery warning for the battery based on the monitored state-of-charge by:
  - calculating an average charge consumption associated with the battery using the monitored state-of-charge; and
  - multiplying the average charge consumption by a trigger period associated with the low-battery warning; and
- if a state-of-charge of the battery reaches the charge threshold, generating the low-battery warning.

15. The computer-readable storage medium of claim 14, wherein monitoring the state-of-charge of the battery involves:
- periodically measuring a voltage of the battery;
- determining the state-of-charge of the battery based on the measured voltage; and
- recording the state-of-charge and a timestamp associated with the measured voltage.

16. The computer-readable storage medium of claim 14, wherein calculating the average charge consumption associated with the battery using the monitored state-of-charge involves:
- calculating a total charge consumption associated with a monitoring window of the monitored state-of-charge; and
- dividing the total charge consumption by a monitoring period spanned by the monitoring window.

17. The computer-readable storage medium of claim 14, wherein the trigger period corresponds to a pre-specified period of time before the battery is fully depleted.

18. The computer-readable storage medium of claim 14, wherein generating the low-battery warning involves:
- displaying the low-battery warning to a user of the electronic device.

19. An electronic device, comprising:
- a monitoring apparatus configured to monitor a state-of-charge of a battery used to power the electronic device; and
- an analysis apparatus configured to calculate a charge threshold associated with a low-battery warning for the battery based on the monitored state-of-charge by calculating an average charge consumption associated with the battery using the monitored state-of-charge and multiplying the average charge consumption by a trigger period associated with the low-battery warning, wherein the low-battery warning is generated if the state-of-charge of the battery reaches the charge threshold.

20. The electronic device of claim 19, wherein the analysis apparatus is further configured to recalculate the charge threshold based on the monitored state-of-charge if the state-of-charge of the battery has not reached the charge threshold.

21. The electronic device of claim 19, wherein calculating the average charge consumption associated with the battery using the monitored state-of-charge involves:
- calculating a total charge consumption associated with a monitoring window of the monitored state-of-charge; and
- dividing the total charge consumption by a monitoring period spanned by the monitoring window.

22. The electronic device of claim 19, wherein the trigger period corresponds to a pre-specified period of time before the battery is fully depleted.

* * * * *